United States Patent
Wang et al.

(10) Patent No.: US 8,229,043 B2
(45) Date of Patent: Jul. 24, 2012

(54) STEPPED GAIN MIXER

(75) Inventors: Xinwei Wang, Dunstable, MA (US);
Xiangdong Zhang, Westford, MA (US)

(73) Assignee: Qualcomm Incorporated, San Diego, CA (US)

( * ) Notice: Subject to any disclaimer, the term of this patent is extended or adjusted under 35 U.S.C. 154(b) by 733 days.

(21) Appl. No.: 12/053,371

(22) Filed: Mar. 21, 2008

(65) Prior Publication Data

US 2009/0238313 A1    Sep. 24, 2009

(51) Int. Cl.
*H04L 27/08*    (2006.01)

(52) U.S. Cl. ..................................... 375/345

(58) Field of Classification Search .............. 375/345, 375/316, 318, 350, 343; 455/78; 257/323, 257/341

See application file for complete search history.

(56) References Cited

U.S. PATENT DOCUMENTS

| | | | |
|---|---|---|---|
| 7,171,184 | B2 | 1/2007 | Samavati |
| 7,177,616 | B2 | 2/2007 | Connell et al. |
| 2005/0124300 | A1* | 6/2005 | Khorram ............... 455/78 |
| 2008/0211010 | A1* | 9/2008 | Hata et al. ............ 257/322 |

FOREIGN PATENT DOCUMENTS

| | | |
|---|---|---|
| EP | 2031756 A1 | 3/2009 |
| GB | 2360155 A | 9/2001 |
| JP | 2001094460 A | 4/2001 |
| JP | 2007514349 A | 5/2007 |
| JP | 2007258861 A | 10/2007 |
| JP | 2007259416 A | 10/2007 |
| WO | WO2007142341 A1 | 12/2007 |

OTHER PUBLICATIONS

International Search Report and Written Opinion—PCT/US2009/037885, International Searching Authority—European Patent Office, Jul. 10, 2009.

* cited by examiner

*Primary Examiner* — Khai Tran
(74) *Attorney, Agent, or Firm* — Qualcomm Patent Group; Larry Moskowitz; James H. Yancey, Jr.

(57) ABSTRACT

An amplified stepped gain mixer portion improves the signal-to-noise ratio of a receiver by using multiple gain states to improve linearity. The mixer portion includes an amplifier, a switch and two transistors. The amplifier output is coupled to the sources of the two transistors. An oscillating signal is present on the transistor gates. The transistor drains are coupled to one another through the switch when the switch is closed. The mixer portion operates in two modes. In a 1/2 mode, the mixer portion output current flows only through the first transistor and not through the second transistor because the switch is open. In a 2/2 mode, the mixer portion output current flows through both transistors. The mixer portion is configured such that the switch is closed when a switching signal is asserted. The switching signal is asserted when a bit of a mixer control register is written to.

25 Claims, 7 Drawing Sheets

| GAIN STATE | LNA GAIN MODE | MIXER GAIN MODE |
|---|---|---|
| 1 | HIGH | 4/4 |
| 2 | HIGH | 3/4 |
| 3 | HIGH | 2/4 |
| 4 | HIGH | 1/4 |
| 5 | MID | 4/4 |
| 6 | MID | 3/4 |
| 7 | MID | 2/4 |
| 8 | MID | 1/4 |
| 9 | LOW | 4/4 |
| 10 | LOW | 3/4 |
| 11 | LOW | 2/4 |
| 12 | LOW | 1/4 |

FIG. 6

| GAIN STATE | GAIN (dBS) | NF(dB) | IIP3 (dBm) | S11 (dB) |
|---|---|---|---|---|
| 1 min | -31.8 | 1.2 | -7.65 | -9.5 |
| 1 mid | -28.6 | 1.6 | -7.4 | -9.2 |
| 1 max | -27.8 | 2.4 | -3.3 | -8.9 |
| 2 | -31.0 | 1.7 | -7.4 | -9.4 |
| 3 | -34.4 | 2.1 | -7.45 | -9.2 |
| 4 | -40.3 | 2.9 | -7.5 | -9.4 |
| 5 | -51.5 | 12.2 | 14.2 | -10.5 |
| 9 | -65.2 | 25.9 | 23.05 | -12.4 |

STEPPED GAIN MIXER

BACKGROUND

1. Field

The present disclosure relates generally to wireless communication devices and, more specifically, to a mixer in a receiver front end that provides stepped gain control.

2. Background

Receivers for wireless communication systems typically require low noise amplifiers (LNAs) followed by double-balanced mixers to pre-amplify incoming signals and to down-convert those signals to an appropriate intermediate frequency (IF) or baseband frequency. Typical receivers have a signal-to-noise ratio (SNR) of no more than about 20 dB. The signal-to-noise ratio imposes a rough limit on the data throughput that a communication system can transmit. For example, a system conforming to the IEEE 802.11g standard with a signal-to-noise ratio of about 20 dB cannot transmit much more than about 25 MB/second of data. Newer wireless communications systems are being developed that are based on orthogonal frequency-division multiplexing (OFDM) and allow higher data rates to be transmitted than is achievable with existing systems that are based on Code Division Multiple Access (CDMA) or Time Division Multiple Access (TDMA).

OFDM achieves higher spectral efficiency by removing guard bands and by spacing carrier sub-channels closely together until they actually overlap. The frequencies of the carrier sub-channels are orthogonal (perpendicular in a mathematical sense) and allow the spectrum of each sub-channel to overlap other sub-channels without interfering with them. The commercial availability of Fast Fourier transform (FFT) chips has made it feasible to demodulate each sub-channel signal. In addition, quadrature amplitude modulation is typically employed to increase the data throughput even more. These newer systems based on OFDM operate under communications standards such as: 3GPP Long-Term Evolution (LTE), Ultra Mobile Broadband (UMB) also known as Evolution-Data Optimized Revision C, WiFi (IEEE 802.11a/g), WiMax (IEEE 802.16) and Digital Video Broadcasting (DVB).

The operation of these newer OFDM communication systems, however, depends on the ability of the receiver to achieve higher signal-to-noise ratios than those of existing wireless communication systems. Moreover, in addition to having a high signal-to-noise ratio at only one particular signal level, a receiver for an OFDM system should also maintain a high signal-to-noise ratio over a large gain control range. For example, it is desirable to maintain a high signal-to-noise ratio over a gain range of at least 35 dB. The signal-to-noise ratio tends to zig-sag over a large gain range where the receiver has just a few large gain steps. Thus, a receiver with many fine gain steps can be used to achieve a consistently high and smooth signal-to-noise ratio over a large gain range.

Power consumption is also an important consideration in the design of receiver front ends, especially for receivers in handheld wireless devices. In a receiver front end, power consumption can be reduced by using passive mixers and avoiding series-configured low noise amplifiers (LNAs). Thus, a design for a receiver is sought that can achieve a smooth signal-to-noise ratio of at least 30 dB over a gain range of at least 35 dB but that maintains this signal-to-noise ratio using only passive mixers and without using series configured low noise amplifiers.

SUMMARY

A receiver uses a novel amplified stepped gain mixer portion to provide a higher signal-to-noise ratio (SNR) than that achievable with conventional mixers. The amplified stepped gain mixer portion includes low-noise amplifiers and stepped gain mixers. The SNR of the receiver transitions smoothly as the gain of the amplified stepped gain mixer portion changes over a wide power range. The amplified stepped gain mixer portion improves the SNR of the receiver by using multiple gain states to improve the linearity of the receiver over a wide dynamic range. Although one benefit of providing a larger gain control range with finer gain steps is to improve SNR, there are also other benefits. For example, the larger gain control range enables the receiver to receive a signal in the presence of jammer interference by lowering the gain and thereby preventing saturation.

In one embodiment, each of the stepped gain mixers operates in four gain modes. Twelve gain states are achieved by applying the four mixer gain modes to each of three amplifier gain modes. The ability to lower the mixer gain mode at each amplifier gain mode enables the receiver to prevent saturation of the receive chains and thereby prevent deterioration in the SNR. The receiver performs IQ demodulation for wireless communication systems that are based on orthogonal frequency division multiplexing (OFDM). The receiver is a differential system that generates an in-phase (I-phase) baseband signal and a quadrature (Q-phase) baseband signal. Each of the two stepped gain mixers receives a differential signal from the low noise amplifiers in the form of a 0-degree (plus) phase and a 180-degree (minus) phase amplified radio frequency (RF) signal. An I-phase local oscillator (LO) signal and a Q-phase LO signal are shifted by ninety degrees from one another. Each of the I-phase LO signal and the Q-phase LO signal is generated differentially in a 0-degree (plus) phase as well as in a 180-degree (minus) phase. The I-phase LO signal is provided to one of the stepped gain mixers, and the Q-phase LO signal is provided to the other stepped gain mixer. One of the stepped gain mixers downconverts the amplified RF signal and generates the I-phase baseband signal, and the other stepped gain mixer downconverts the amplified RF signal and generates the Q-phase baseband signal.

In one embodiment, the receiver comprises an RF transceiver integrated circuit (IC) and a digital baseband IC. The RF transceiver IC contains the amplified stepped gain mixer portion and a mixer control register that controls the stepped gain mixers. The digital baseband IC communicates mixer control information across an SPI serial bus, through the mixer control register, to the stepped gain mixers. In another embodiment, both the analog and the digital functions are performed on a single integrated circuit, called a system on a chip (SOC). The system on a chip includes the receiver front end, a receiver baseband processing block and a digital control block. The digital control block controls the receiver operations, including the stepped gain mixers.

In another embodiment, a stepped gain mixer portion includes an amplifier, a switch and first and second transistors. An oscillating signal is present on the gates of the first and second transistors. In one aspect, the oscillating signal is generated by a frequency synthesizer. The oscillating signal may also be generated by an external crystal, an external clock or an internal RC or ring oscillator. The input lead of the amplifier is coupled to an antenna, and the output lead of the amplifier is coupled to the source lead of the first transistor and to the source lead of the second transistor. The drain lead of the first transistor is coupled to the drain lead of the second transistor through the switch when the switch is closed. The stepped gain mixer portion operates in a 1/2 mode and in a 2/2 mode. In the 1/2 mode, the output current from stepped gain mixer portion flows only through the first transistor. Output current does not flow through the second transistor in the 1/2 mode because the switch is open. In the 2/2 mode, output current from the stepped gain mixer portion flows through both the first and second transistors. The stepped gain mixer portion is configured such that the switch is closed when a switching signal is asserted. In one aspect, the switching signal is asserted when a digital one is written into a bit of a mixer control register.

In yet another embodiment, a stepped gain mixer operates in a first mode and in a second mode. The stepped gain mixer has eight transistors and three switches. In the first mode, the first and second switches are closed, and the third switch is open. In the second mode, the first and second switches are open, and the third switch is closed.

A plus phase of a differential radio frequency input signal is present on each of the source leads of the first, second, third and fourth transistors. A minus phase of the differential radio frequency input signal is present on each of the source leads of the fifth, sixth, seventh and eighth transistors. A minus-phase of an oscillator signal is present on the gate leads of the first, second, fifth and sixth transistors, and a plus-phase of the oscillator signal is present on the gate leads of the third, fourth, seventh and eighth transistors. A plus phase of a differential baseband output current is present on the drain lead of the first transistor, and a minus phase of the differential baseband output current is present on the drain lead of the fifth transistor. The magnitude of the differential baseband output current in the first mode is greater than the magnitude of the differential baseband output current in the second mode.

The drain lead of the third transistor is coupled to the drain lead of the sixth transistor; the drain lead of the fourth transistor is coupled to the drain lead of the fifth transistor; the drain lead of the seventh transistor is coupled to the drain lead of the second transistor; and the drain lead of the eighth transistor is coupled to the drain lead of the first transistor. The first switch is coupled to the drain lead of the second transistor. The drain lead of the second transistor is coupled to the drain lead of the first transistor through the first switch when the first switch is closed in the first mode. The second switch coupled to the drain lead of the sixth transistor. The drain lead of the sixth transistor is coupled to the drain lead of the fifth transistor through the second switch when the second switch is closed in the first mode. The drain lead of the second transistor is coupled through the third switch to the drain lead of the sixth transistor when the third switch is closed in the second mode. In the second mode, current loops from the drain lead of the second transistor, through the third switch, and to the drain lead of the sixth transistor.

In yet another embodiment, a radio frequency input signal is received onto the source leads of a first transistor and a second transistor. An oscillator signal is received onto the gate leads of the first transistor and the second transistor. Neither the first transistor nor the second transistor receives a biasing current. A baseband signal is output from the drain lead of the first transistor. The magnitude of the current of the baseband signal is increased by coupling the drain lead of the first transistor to the drain lead of the second transistor. The drain lead of the first transistor is coupled to the drain lead of the second transistor by closing a switch that is coupled to both the drain lead of the first transistor and the drain lead of the second transistor. The switch is closed when a bit of a mixer control register is written to and a switching signal is asserted.

In yet another embodiment, a circuit includes two transistors. Neither of the two transistors receives a biasing current.

An amplified radio frequency signal is present on a first lead of the first transistor and on a first lead of the second transistor. An oscillating signal is present on the gate leads of the first transistor and the second transistor. A baseband signal is present on a second lead of the first transistor. The circuit also includes a means for controlling the magnitude of the current of the baseband signal by coupling the second lead of the first transistor to a second lead of the second transistor. The magnitude of the current of the baseband signal increases when the second lead of the first transistor is coupled to the second lead of the second transistor by closing a switch included in the means. The magnitude of the current of the baseband signal increases in response to writing to a bit of a register included in the means.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

Like numerals indicate like components in the accompanying drawings of the various embodiments.

FIG. 6 is a table showing the twelve gain states achieved by the amplified stepped gain mixer portion of FIG. 3;

DETAILED DESCRIPTION

Reference will now be made in detail to the various embodiments, examples of which are illustrated in the accompanying drawings.

Figure 1:
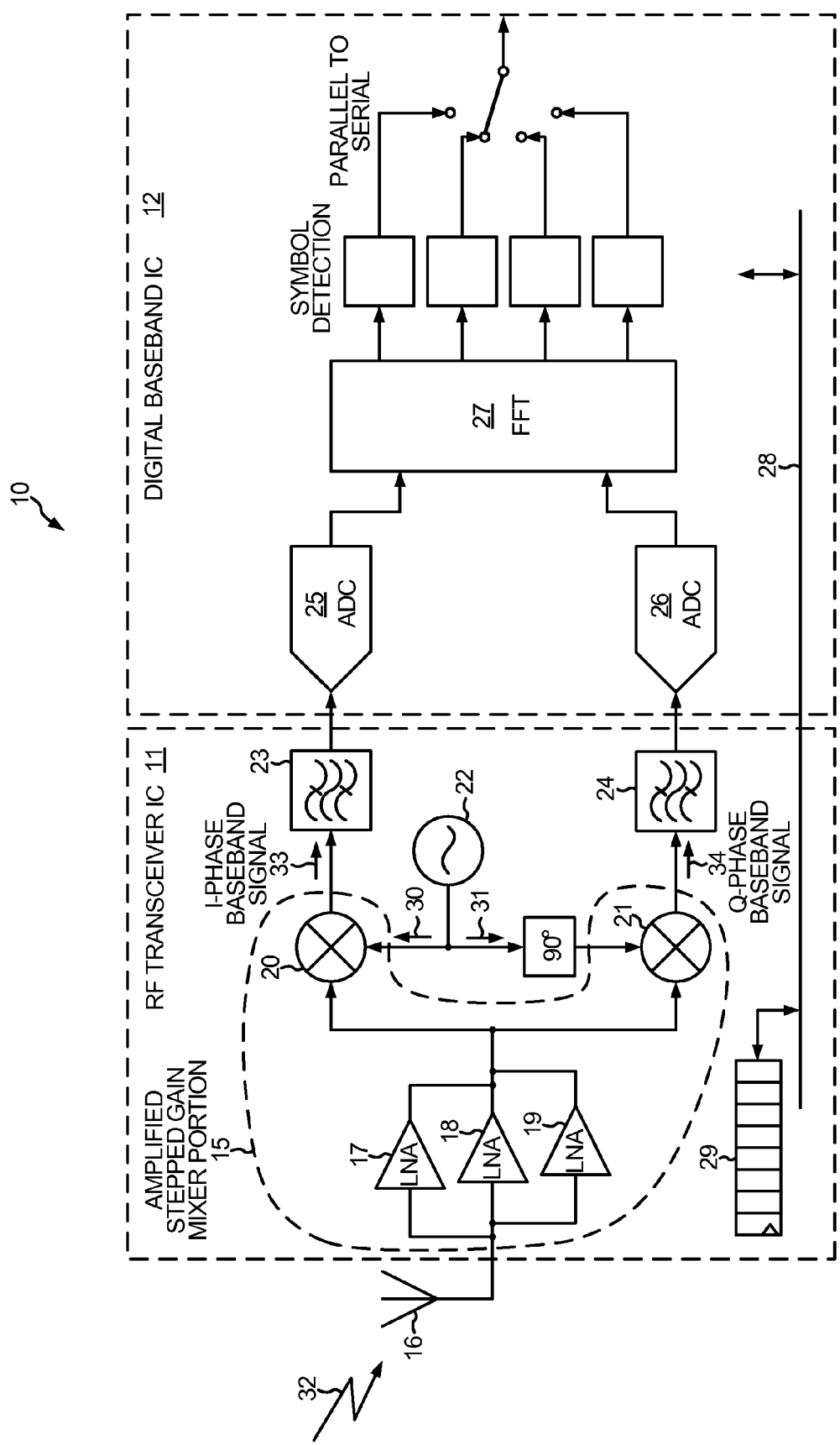
FIG. 1 is a simplified schematic block diagram of a receiver that uses an amplified stepped gain mixer portion to provide larger gain control range and a higher signal-to-noise ratio than that achievable with conventional mixers.

FIG. 1 is a simplified block diagram of a receiver 10 that performs IQ demodulation for a wireless communication system based on orthogonal frequency division multiplexing (OFDM). In one embodiment, the functions of receiver 10 are performed by a radio frequency (RF) transceiver integrated circuit (IC) 11 and a digital baseband IC 12. RF transceiver IC 11 is called a "transceiver" because it includes a transmitter as well as a receiver. The circuitry that performs the transmitting functions of RF transceiver IC 11 is not shown in FIG. 1. Receiver 10 uses an amplified stepped gain mixer portion 15 to provide a higher signal-to-noise ratio than that achievable with conventional mixers. The higher signal-to-noise ratio is achieved in part by providing a larger gain control range. The signal-to-noise ratio of receiver 10 transitions smoothly as the gain of amplified stepped gain mixer portion 15 increases over a wide power range. Thus, amplified stepped gain mixer portion 15 provides receiver 10 with fine gain steps and a large gain control range (GCR).

In another embodiment of receiver 10 not shown in FIG. 1, both the analog and the digital functions of receiver 10 are performed on a single integrated circuit, called a system on a chip (SOC). The system on a chip includes amplified stepped gain mixer portion 15, a receiver baseband processing block and a digital control block. The digital control block controls the receiver operations, including the amplifiers and mixers of amplified stepped gain mixer portion 15.

Receiver 10 includes an antenna 16, three low noise amplifiers (LNAs) 17-19, stepped gain mixers 20-21, a frequency synthesizer 22, band pass filters 23-24, analog-to-digital converters 25-26 and a Fast Fourier transform (FFT) block 27. In addition, receiver 10 includes a serial peripheral interface (SPI) bus 28 over which RF transceiver IC 11 and a digital baseband IC 12 communicate. RF transceiver IC 11 includes a mixer control register 29 that controls stepped gain mixers 20-21. Mixer control register 29 can be written to from SPI serial bus 28. Digital baseband IC 12 tunes receiver 10 by controlling the frequency of local oscillator (LO) signals 30 and 31 supplied by frequency synthesizer 22 to stepped gain mixers 20 and 21, respectively. Digital baseband IC 12 communicates mixer control information across SPI serial bus 28, through mixer control register 29, to stepped gain mixers 20-21.

When receiver 10 is receiving, an RF signal 32 is received onto antenna 16 and then is either amplified or attenuated by low noise amplifiers 17-19. Receiver 10 is designed to demodulate an RF signal having a carrier frequency between 700 MHz and 5.5 GHz. As the carrier frequency increases from 700 MHz to 5.5 GHz, the gain of amplified stepped gain mixer portion 15 decreases. Where the loss in gain over this frequency variation is not compensated, the gain may even decrease by as much as 50% for an RF signal of constant strength. The loss in gain is mainly due to the parasitic capacitance of the metal-oxide-semiconductor field-effect transistors (MOSFETs) in stepped gain mixers 20-21.

In one example, the carrier frequency of RF signal 32 is centered at 5.1 GHz and has a bandwidth of 20 MHz. Thus, the frequency of the carrier signal ranges from 5.099 GHz to 5.101 GHz. A local oscillator frequency is then used to demodulate the carrier signal and to downconvert RF signal 32 to baseband signals 33-34. In this example, frequency synthesizer 22 generates a local oscillator frequency of 5.1 GHz, and stepped gain mixers 20-21 generate a baseband signal with a bandwidth of 10 MHz. Receiver 10 is a differential, quadrature-based system that generates an in-phase (I-phase) baseband signal 33 and a quadrature (Q-phase) baseband signal 34. The I-phase LO signal 30 provided to mixer 20 and the Q-phase LO signal 31 provided to mixer 21 are shifted by ninety degrees from one another. In addition, each of I-phase LO signal 30 and Q-phase LO signal 31 is generated differentially in a 0-degree (plus) phase as well as a 180-degree (minus) phase. Low noise amplifiers 17-19 provide an amplified or attenuated (depending on the gain state) differential RF signal 32 equally to both mixers 20-21 such that in-phase and quadrature phase baseband signals 33-34 are treated consistently. Each of the two stepped gain mixers 20-21 receives the differential signal from low noise amplifiers 17-19 in the form of a plus-phase and a minus-phase amplified RF signal. Stepped gain mixer 20 downconverts an amplified RF signal and generates I-phase baseband signal 33, which is then filtered by band pass filter 23. Similarly, stepped gain mixer 21 downconverts an amplified RF signal and generates the Q-phase baseband signal 34, which is then filtered by band pass filter 24. This configuration of two mixers driven from the same RF input signal and driven by local oscillator signals ninety degrees out-of-phase is referred to as a quadrature demodulator. The I and Q phases 33-34 of the filtered baseband signal are then passed to digital baseband IC 12. Analog-to-digital converters 25-26 then digitize baseband signals 33-34 into one or more digital streams for baseband processing in digital baseband IC 12. One of the steps of baseband processing involves FFT block 27 converting the digital streams into symbols for subsequent digital signal processing.

In another example, receiver 10 is not a differential system but is rather single-ended. The single-ended receiver system does not employ plus and minus phase signals.

Increasing the signal-to-noise ratio (SNR) of a receiver by reducing the thermal noise generated by the receiver is effective only to a certain extent. Even where the SNR has been increased by reducing the thermal noise, the SNR deteriorates rapidly when a receive chain saturates, and the response of the receiver becomes non-linear. Therefore, besides reducing thermal noise, the overall SNR of a receiver can be improved by reducing the non-linearity of the receiver front end. Amplified stepped gain mixer portion 15 improves the SNR of receiver 10 by improving the linearity using multiple gain states. Twelve gain states are achieved by providing four mixer gain modes for each of three amplifier gain modes of low noise amplifiers 17-19. Low noise amplifiers 17-19 have the ability to reduce the RF signal strength so that the receive chains do not saturate at even very large input signal strengths. The fine gain steps prevent deterioration in the SNR at the highest mixer gain mode of each amplifier gain mode.

Low noise amplifiers 17-19 are connected in parallel. Only one of the low noise amplifiers is operational at any given time. Each low noise amplifier corresponds to one of the three amplifier gain modes. Each low noise amplifier is turned on or off by turning on or off the biasing current to that low noise amplifier. The biasing current is controlled by a register in RF transceiver IC 11 (not shown in FIG. 1) that is written to by digital baseband IC 12 using SPI serial bus 28. By operating only one low noise amplifier at a time, parasitic coupling between low noise amplifiers is avoided. Non-linearity in the response of a second stage, series-connected low noise amplifier caused by the second stage easily saturating is also avoided. In addition, difficulties associated with matching the impedance between the first and second stages of series-connected low noise amplifiers are avoided. Current consumption is also reduced by not connecting the low noise amplifiers in series.

In one embodiment, the three low noise amplifiers 17-19 have transconductance gains of about −22 dBS, −44 dBS and −58 dBS, respectively. Thus, when first LNA 17 is on, the ratio between the input voltage of RF signal 32 and the output current of first LNA 17 is about −22 dBS. The three low noise amplifiers 17-19 by themselves provide a gain control range of about 36 dB (−22 dBS through −58 dBS). The conversion loss of each stepped gain mixer 20-21 is about −7 dB. So the corresponding transconductance gain of first LNA 17 plus either in-phase stepped gain mixer 20 or quadrature-phase stepped gain mixer 21 is about −29 dBS. The gain control range of amplified stepped gain mixer portion 15 resulting from the three low noise amplifiers 17-19 is therefore between about −29 dBS and −65 dBS, for a total range of about 36 dB.

Each of stepped gain mixers 20-21 operates in four gain modes. In the highest attenuating gain mode, each stepped gain mixer provides an additional transconductance gain of about −12 dBS. The transconductance gain corresponding to the third amplifier gain mode of LNA 19 plus the highest attenuating mixer gain mode of either in-phase stepped gain mixer 20 or quadrature-phase stepped gain mixer 21 is about −77 dBS. The total gain control range of amplified stepped gain mixer portion 15 from the first amplifier gain mode with the lowest attenuating mixer gain mode (−29 dBS) to the third amplifier gain mode with the highest attenuating mixer gain mode (−77 dBS) is therefore about −48 dBS.

Figure 2:
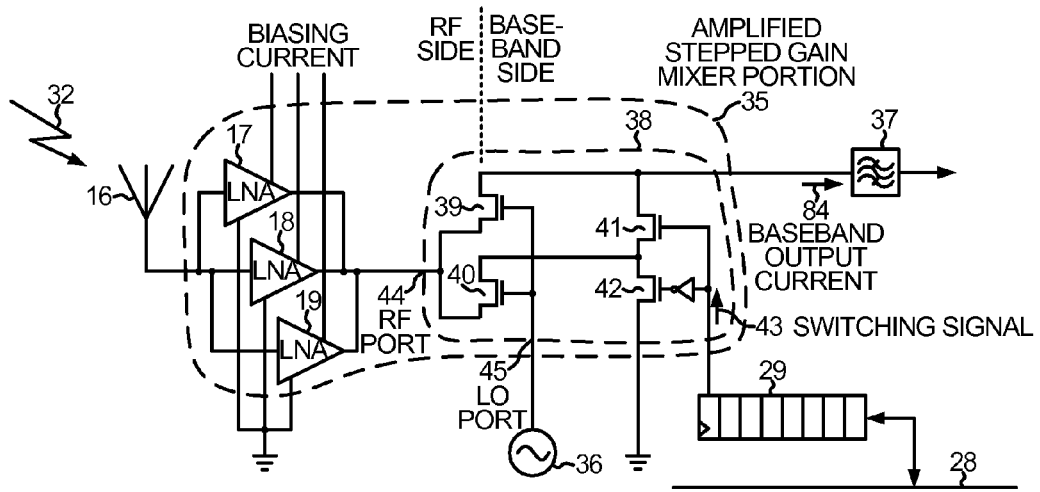
FIG. 2 is a simplified schematic block diagram of another embodiment of the amplified stepped gain mixer portion of FIG. 1 that operates in six gain states.

The operation of amplified stepped gain mixer portion 15 is now explained with relation to the simplified embodiment 35 shown in FIG. 2. Simplified embodiment 35 operates in six gain states that are achieved by providing two mixer gain modes for each of three amplifier gain modes. Simplified embodiment 35 performs basic downconversion demodulation without quadrature amplitude modulation and without generating differential signals. FIG. 2 shows simplified embodiment 35 of an amplified stepped gain mixer portion coupled to antenna 16, a local oscillator 36 and a baseband filter 37. Simplified embodiment 35 includes the three low noise amplifiers 17-19 coupled to a stepped gain mixer 38. Stepped gain mixer 38 has two MOSFET transistors 39-40 and two switches 41-42, which are also MOSFET transistors in this embodiment. Each of the transistors 39-40 that is used as a mixer is about three times as large as the transistors 41-42 that are used as switches. In each of the three amplifier gain modes, stepped gain mixer 38 can operate in either a 1/2 mode or a 2/2 mode. In the 1/2 mode, output current from stepped gain mixer 38 to baseband filter 37 flows only through n-channel field effect transistor 39. Output current does not flow through n-channel field effect transistor 40 in the 1/2 mode because switch 41 is open and switch 42 is closed. In the 2/2 mode, output current from stepped gain mixer 38 flows through both FET 39 and FET 40. Stepped gain mixer 38 is configured such that switch 41 is closed and switch 42 is open when a switching signal 43 is asserted. In one embodiment, switching signal 43 is asserted when a digital one is written into the eighth bit of mixer control register 29.

By deasserting switching signal 43, the front-end gain of simplified embodiment 35 can be reduced in each of the three amplifier gain modes. The ability to operate in the 1/2 mixer gain mode doubles the number of gain states of simplified embodiment 35. By providing more gain states, the likelihood of the receive chain saturating is reduced, and the signal-to-noise ratio of amplified stepped gain mixer portion 35 is maintained at a higher level over the entire gain control range. The additional mixer gain states of simplified embodiment 35 are achieved using a passive mixer configuration with no biasing current supplied to transistors 39-40. Additional mixer gain states are achieved with the passive mixer configuration without significantly increasing current consumption. In addition, the switches 41-42 used to provide the additional mixer gain states do not significantly degrade performance by adding parasitic capacitance at baseband. The switches 41-42 do not significantly increase the effects of parasitic capacitance of stepped gain mixer 38 because they are placed on the baseband side of mixer transistors 39-40, as opposed to on RF port 44 or local oscillator port 45 of stepped gain mixer 38. The impedance on RF port 44 and local oscillator port 45 remains constant while switching between mixer gain states. Adding parasitic capacitance to the high frequency environments on RF port 44 or local oscillator port 45 would result in a low impedance that would attenuate RF signal 32 significantly. For example, an added parasitic capacitance of one picofarad that results in an impedance of only about twenty ohms in the high frequency environment of RF port 44 would result in a much higher two kilo-ohm impedance on the lower frequency baseband side of stepped gain mixer 38. The higher two kilo-ohm impedance does not significantly affect the baseband signal.

Figure 3:
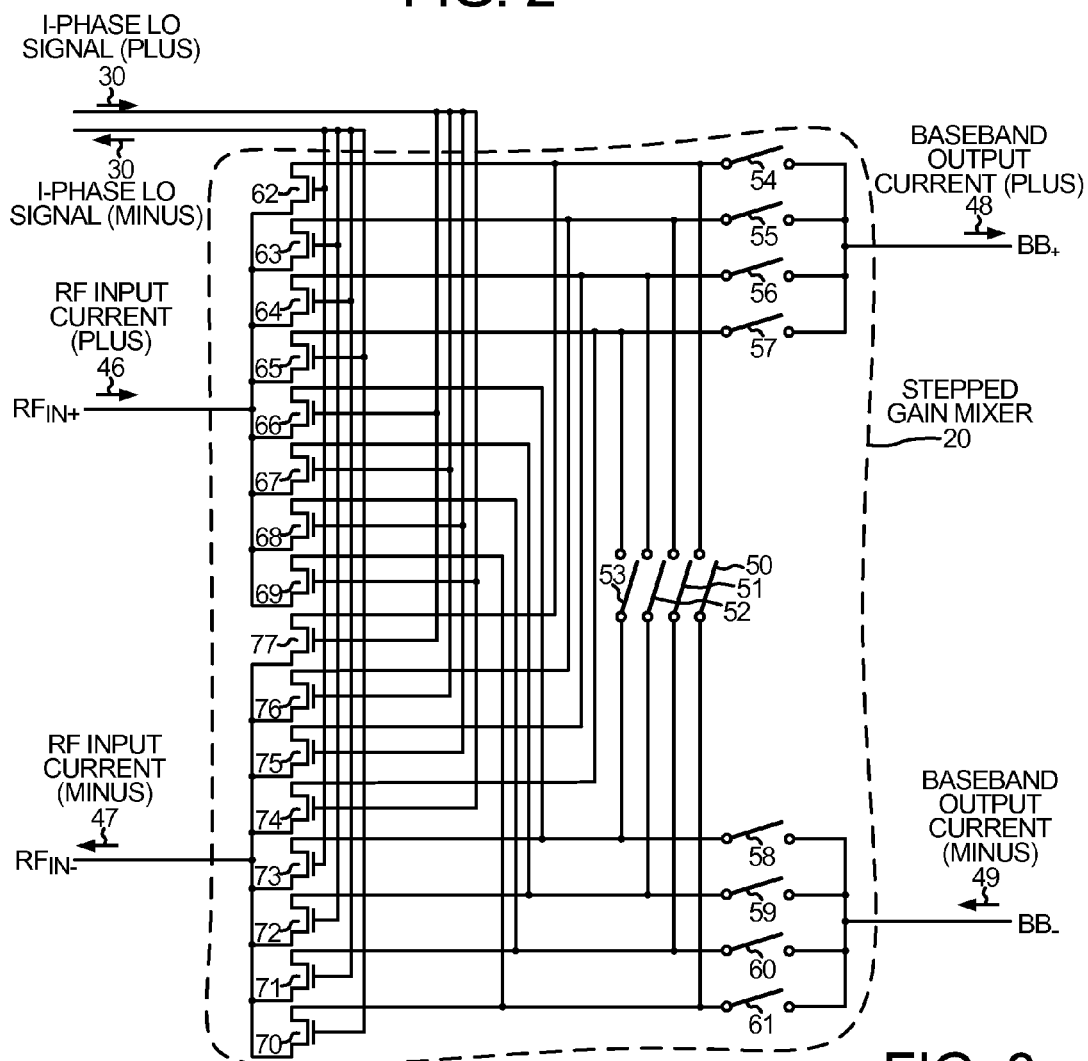
FIG. 3 is a simplified schematic block diagram of another embodiment of the amplified stepped gain mixer portion of FIG. 1 that operates in twelve gain states.

FIG. 3 shows another embodiment of stepped gain mixer 20 of amplified stepped gain mixer portion 15. In the embodiment of FIG. 3, an amplified differential RF input signal 32 drives double-balanced stepped gain mixer 20 operating in response to a differential local oscillator signal output by frequency synthesizer 22. Low noise amplifiers 17-19 output both a 0-degree (plus) phase 46 and a 180-degree (minus) phase 47 of differential RF input current. The output of stepped gain mixer 20 is the differential I-phase baseband signal 33 representative of the differential RF input signal 32 down-converted at the local oscillator frequency. Stepped gain mixer 20 receives the I-phase LO signal 30 provided by frequency synthesizer 22. Stepped gain mixer 20 outputs both a plus-phase 48 and a minus-phase 49 of the output current of I-phase baseband signal 33.

In a configuration similar to that shown in FIG. 3, stepped gain mixer 21 also receives both the plus-phase 46 and minus-phase 47 of amplified differential RF input current. Stepped gain mixer 21 receives the differential Q-phase LO signal 31 that is shifted by 90 degrees from I-phase LO signal 30. Stepped gain mixer 21 outputs both a plus-phase and a minus-phase of Q-phase baseband signal 34.

In the embodiment of FIG. 3, the plus-phase and minus-phase sides of stepped gain mixer 20 are combined with shunt switches 50-53 and series switches 54-61 to form a differential, double-balanced stepped gain mixer. Receiver 10 operates as a differential receiver because low noise amplifiers 17-19 and stepped gain mixers 20-21 operate differentially. Stepped gain mixer 20 is "double-balanced" because both the RF side and the baseband side operate differentially. Each of the plus-phase and minus-phase sides of stepped gain mixer 20 is comprised of eight n-channel field effect transistors. The plus-phase side of stepped gain mixer 20 includes transistors 62-69, and the minus-phase side of stepped gain mixer 20 includes transistors 70-77. The gates of four (66-69, 74-77) of the eight FETs of each of the plus-phase and minus-phase sides of stepped gain mixer 20 are coupled to the plus phase of the I-phase of LO signal 30. The gates of the other four (62-65, 70-73) of the eight FETs of each of the plus-phase and minus-phase sides of stepped gain mixer 20 are coupled to the minus phase of the I-phase of LO signal 30. Switches 50-61 are configured such that symmetry is maintained between the plus-phase and minus-phase sides of stepped gain mixer 20. By asserting and deasserting switching signals to switches 50-61, stepped gain mixer 20 can be controlled to operate in four mixer gain modes (4/4, 3/4, 2/4 and 1/4). In the 1/4 mode, current flows through four of the sixteen transistors 62-77. In the 4/4 mode, current flows through all sixteen of the transistors 62-77. In the four mixer gain modes, either one, two, three or four of the switches in all three of the switch group (50-53, 54-57 and 58-61) is closed. Therefore, only four switching signals are required to operate the twelve switches 50-61, and only four bits of mixer control register 29 are required to operate stepped gain mixer 20 in the four mixer gain modes. Because stepped gain mixer 21 operates analogously to mixer 20, the same four bits can be used to control both stepped gain mixers 20-21.

In the embodiment of FIG. 3, all of the sixteen transistors 62-77 are the same size. Thus, one-quarter of the current flows through four transistors in the 1/4 mode as flows through sixteen transistors in the 4/4 mode. Consequently, where the baseband output current in the 4/4 mode results in an amplification of 0 dB, the attenuation in the 3/4, 2/4 and 1/4 modes corresponds to −2.5 dB, −6 dB and −12 dB, respectively. In another embodiment of stepped gain mixer 20, each of the sixteen transistors 62-77 are not of equal size. For example, the relative transistor size of the four transistor groups (62, 70, 69, 77; 63, 71, 68, 76; 64, 72, 67, 75; and 65, 73, 66, 74) can be chosen such that the amplification of the four modes (4/4, 3/4, 2/4, 1/4) results in linear steps in dB. The relative amplification of the four modes (4/4, 3/4, 2/4, 1/4), for example, could be 0 dB, −2 dB, −4 dB and −6 dB.

Figure 4:
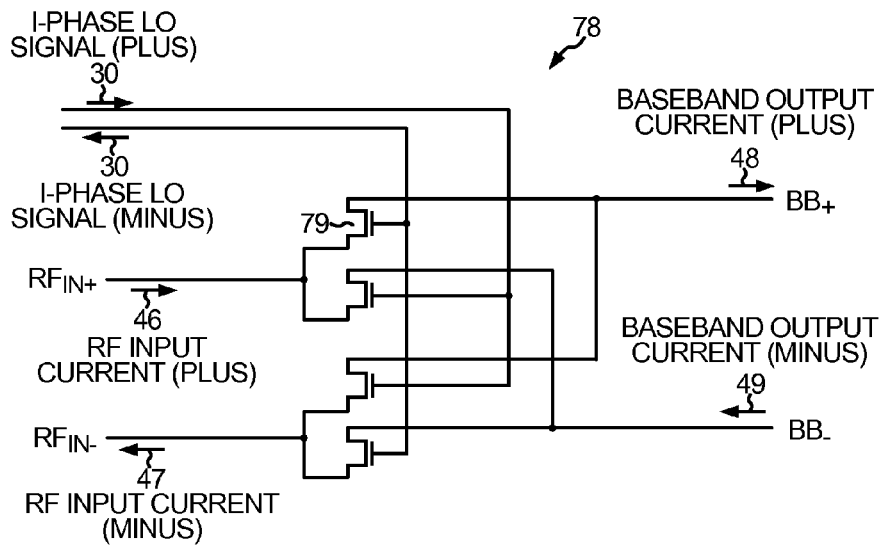
FIG. 4 is a diagram showing a differential, double-balanced mixer that is equivalent to the four-quarter (4/4) mode of the amplified stepped gain mixer portion of FIG. 3.

The four-quarter (4/4) mode of stepped gain mixer 20 corresponds to the highest gain mode when RF input current flows through all sixteen transistors 62-77. In the four quarter mode, all four shunt switches 50-53 are open, and all eight series switches 54-61 are closed. FIG. 4 shows a differential, double-balanced mixer 78 that is equivalent to the four-quarter (4/4) mode of differential, double-balanced stepped gain mixer 20. For example, the magnitude of the plus phase 46 of RF input current flowing through a transistor 79 of mixer 78 is equivalent to the magnitude of plus phase 46 of the RF input current flowing through the four transistors 62-65 of stepped gain mixer 20 in FIG. 3.

Returning to FIG. 3, in the one-quarter (1/4) mode of stepped gain mixer 20, series switches 54 and 61 are closed, as are shunt switches 51-53; all other switches are open. The baseband current flowing out of the three transistors 63-65 loops back around to the minus side of stepped gain mixer 20 and returns to the plus side through transistors 66-68. The shunt current that loops back around does not flow through the signal paths of stepped gain mixer 20. Plus-phase RF input current 46 flowing through transistors 62 and 77 flows out through switch 54 as the plus phase 48 of in-phase baseband signal 34. Minus-phase RF input current 47 flowing through transistors 69 and 70 flows out switch 61 as the minus phase 49 of in-phase baseband signal 34. The one-quarter (1/4) mode has about a −12 dB attenuation compared to the four-quarter (4/4) mode.

Figure 5:
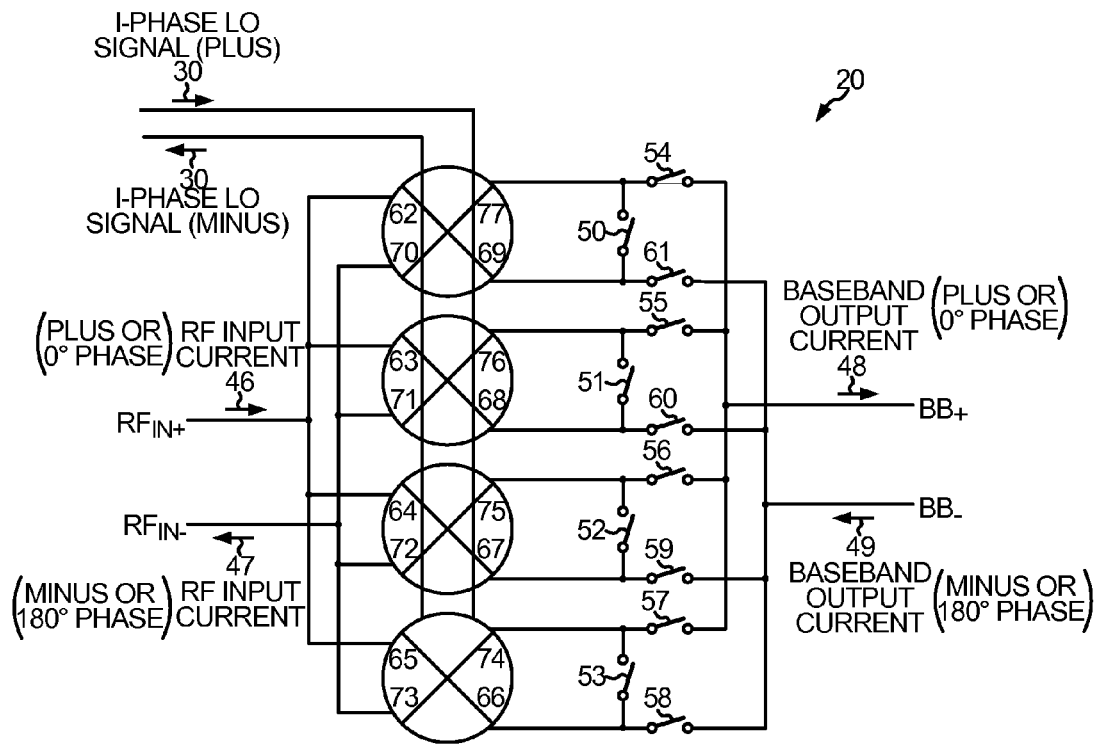
FIG. 5 is another type of simplified block diagram showing circuit configuration that is similar to the amplified stepped gain mixer portion of FIG. 3.

FIG. 5 shows another type of simplified block diagram of the embodiment of FIG. 3. Both FIG. 3 and FIG. 5 represent a similar circuit configuration of stepped gain mixer 20. FIG. 5 uses the crossed circle notation for a mixer. The reference numerals in the crossed circles of FIG. 5 correspond to the numbered transistors in FIG. 3. The block diagram of FIG. 5 also designates the physical implementation of the transistors in the stepped gain mixer 20. FIG. 5 indicates that the transistors of stepped gain mixer 20 are grouped as four separate mixers.

FIG. 6 shows the twelve gain states achieved by combining the four mixer gain modes of mixer 20 or mixer 21 with the three amplifier gain modes of low noise amplifiers 17-19. Gain state one has the highest gain, and gain state twelve has the lowest gain (or the largest attenuation).

Figure 7:
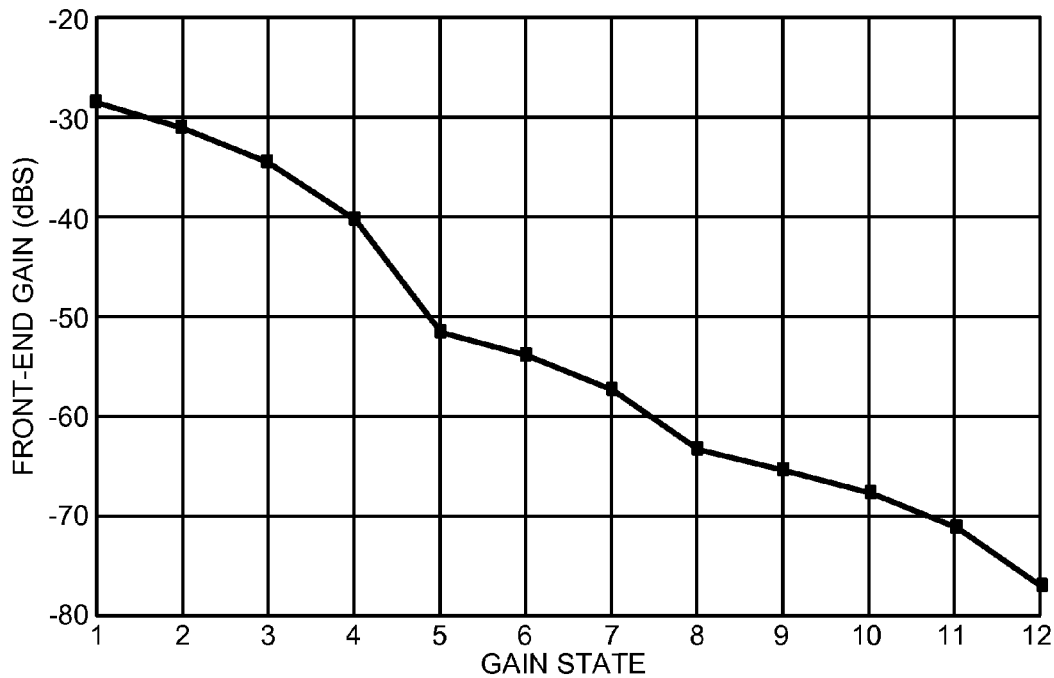
FIG. 7 is a diagram plotting the front-end gain of the amplified stepped gain mixer portion of FIG. 3 at each of the twelve gain states of FIG. 6.

FIG. 7 is a graph of the front-end gain of amplified stepped gain mixer portion 15 at each of the twelve gain states of FIG. 6. The front-end gain in dBS is a measure of the transconductance gain of the low noise amplifier that is being used in the corresponding gain state plus the gain of the mixer transistors that are being used. The transconductance gain compares the input voltage into one of the low noise amplifiers 17-19 to the baseband output current exiting stepped gain mixers 20-21. The front-end gain in FIG. 7 was simulated at a frequency of RF signal 32 that was centered on 5.5 GHz. The average dc current consumption of amplified stepped gain mixer portion 15 over the gain control range in FIG. 7 was 12.7 mA. FIG. 7 shows that the gain control range is extended from −65 dBS at gain state nine to −77 dBS at gain state twelve by using the additional three mixer gain modes (3/4, 2/4 and 1/4). An overall gain control range of about 50 dB is achieved from about −28.6 dBS at gain state one to about −77 dBS at gain state twelve.

Figure 8:
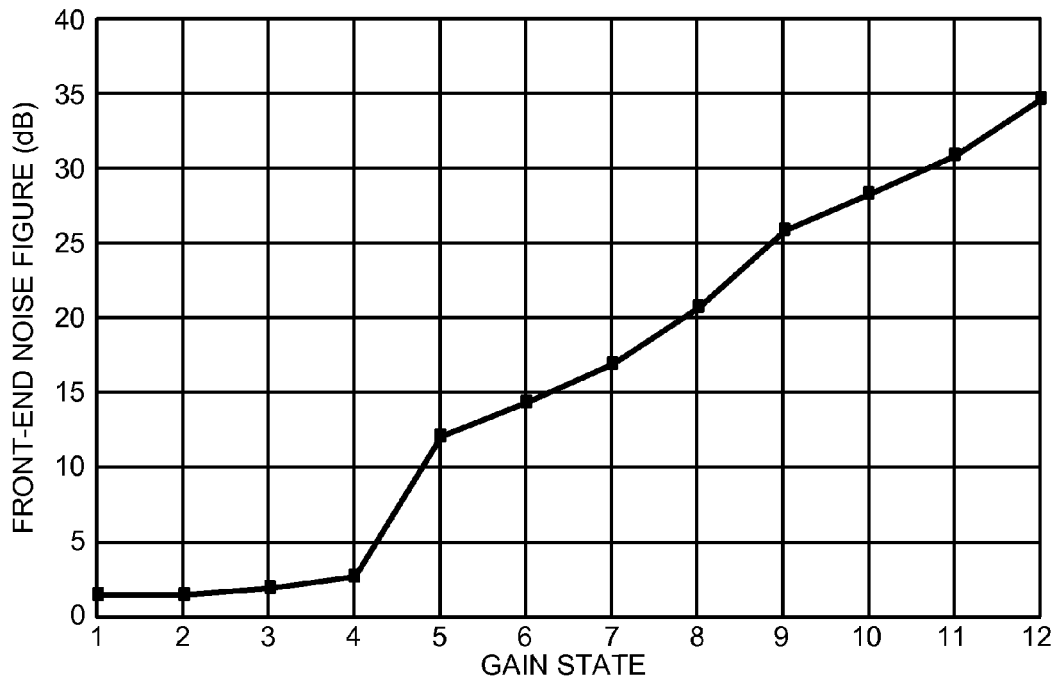
FIG. 8 is a diagram plotting the front-end noise figure of the amplified stepped gain mixer portion of FIG. 3 at each of the twelve gain states of FIG. 6.

FIG. 8 is a graph of the front-end noise figure of amplified stepped gain mixer portion 15 at each of the twelve gain states of FIG. 6. The front-end noise figure compares the noise added by the amplifiers and mixers to the input thermal noise to amplified stepped gain mixer portion 15. At the lowest gain state twelve, amplified stepped gain mixer portion 15 adds 35 dB of noise to the thermal noise received by amplified stepped gain mixer portion 15. At the highest gain state one, amplified stepped gain mixer portion 15 adds only 1.6 dB of noise. The added noise indicated in FIG. 8 does not include nonlinearity noise added.

Figures 9, 10:
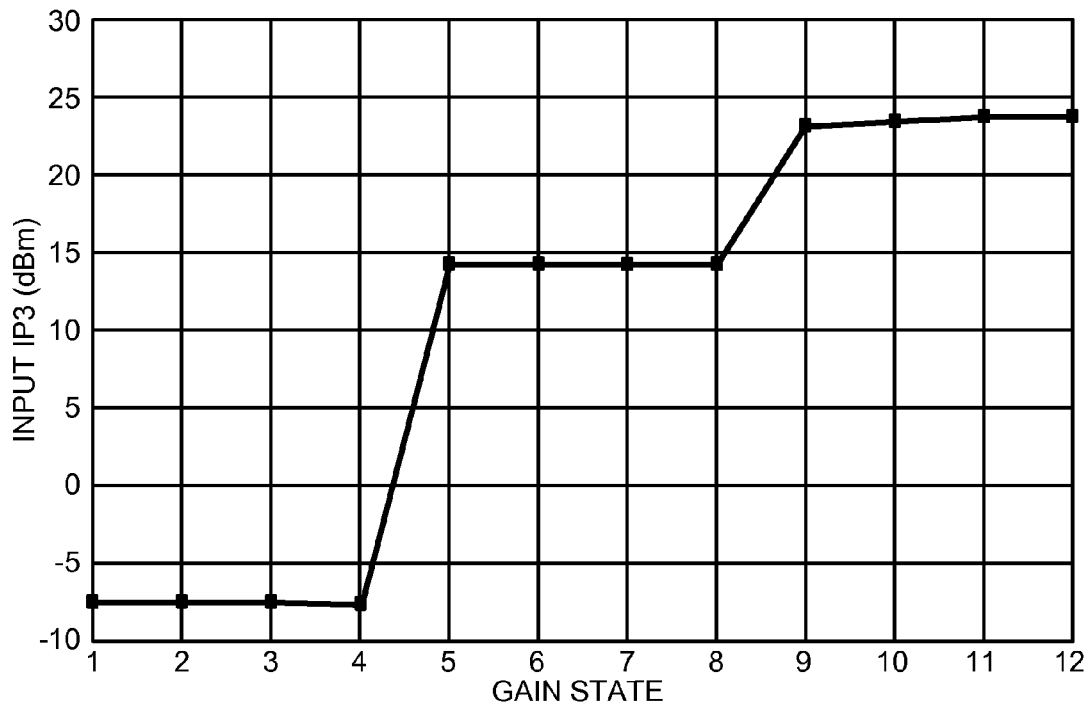
FIG. 9 is a diagram plotting the input third-order intercept point (input IP3) of the amplified stepped gain mixer portion of FIG. 3 at each of the twelve gain states of FIG. 6.
FIG. 10 is a table listing various performance indicators at gain state one over process corners of the amplified stepped gain mixer portion of FIG. 3.

FIG. 9 is a graph of the input third-order intercept point (input IP3) of amplified stepped gain mixer portion 15 at each of the twelve gain states of FIG. 6. The IIP3 figure is a power measurement in dB relative to one milliwatt (dBm) and is an indication of the linearity of amplified stepped gain mixer portion 15. FIG. 9 indicates that the IIP3 of amplified stepped gain mixer portion 15 is about 14 dBm at gain state five. Thus, at gain state five amplified stepped gain mixer portion 15 can tolerate an input RF signal having a power of about 0 dBm without saturating the receive chains. The linearity of amplified stepped gain mixer portion 15 is poor at the gain states one through four. Performance is not harmed by the poor linearity at high gain states, however, because when the magnitude of input RF signal 32 is low and the gain is high, a small RF signal 32 will not saturate the receive chains. At the higher gain states nine through twelve, the linearity of amplified stepped gain mixer portion 15 is good. For example, the input linearity is about 24 dBm at gain state ten, and amplified stepped gain mixer portion 15 can tolerate a larger input signal. An input RF signal 32 with about 10 dBm of input power can be demodulated at gain state ten without saturating the receive chains.

FIG. 10 is a table listing various performance indicators at gain state one over process corners of amplified stepped gain mixer portion 15. The performance indicators are simulated for gain state one over an RF frequency ranging from 5.1 GHz to 5.9 GHz, over a power supply voltage varying by ±5%, over a temperature range from −30 to 85 degrees Celsius, and over various silicon process corners. The gain values of FIG. 10 correspond to the front-end gain values of FIG. 7 for the listed gain states. The noise figure values correspond to the front-end noise figure values of FIG. 8. The IIP3 values correspond to the input IP3 values of FIG. 9. FIG. 10 also includes S11 values indicating the input return loss for the listed gain states.

Figure 11:
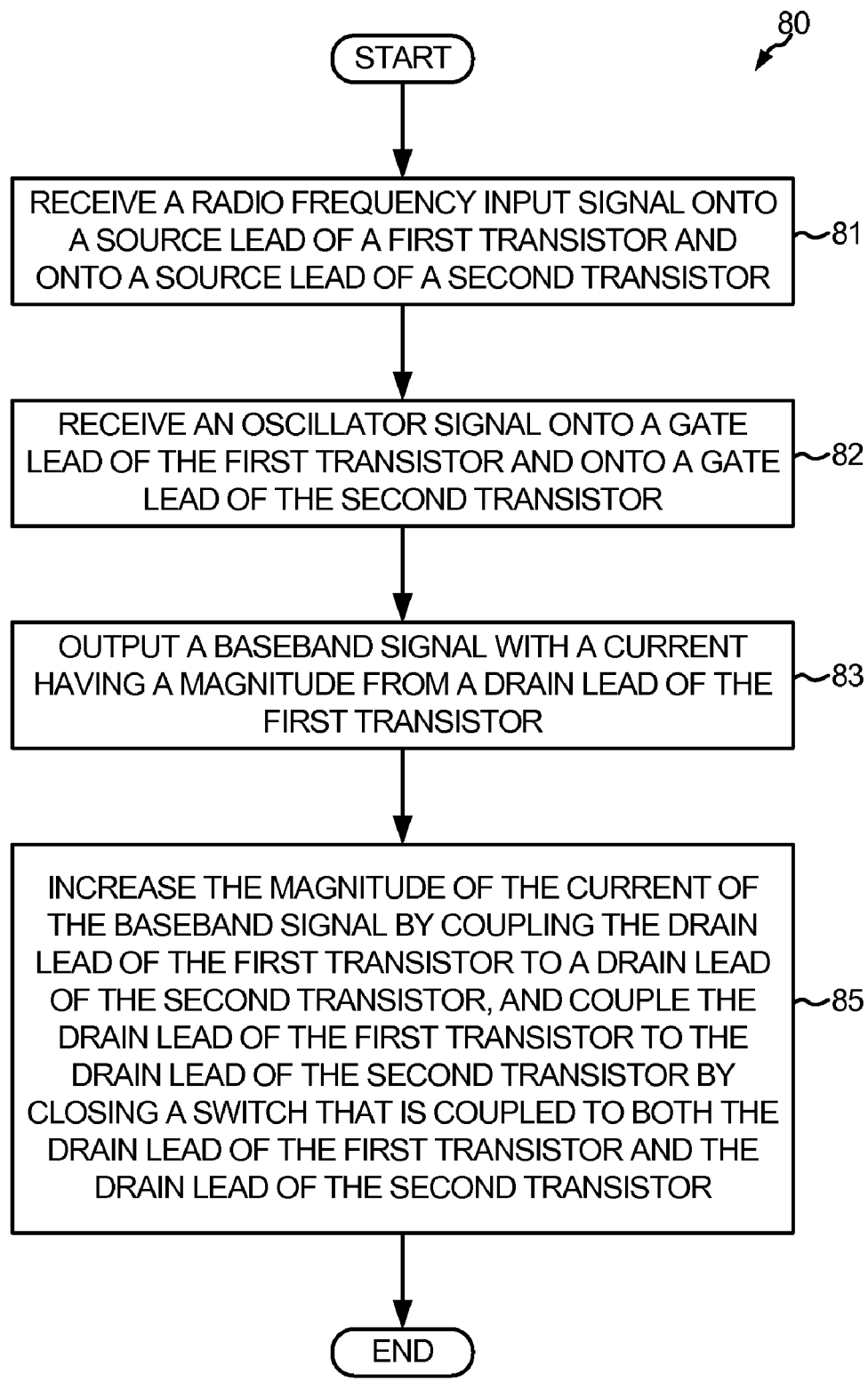
FIG. 11 is a flowchart of a method in accordance with one novel aspect.

FIG. 11 is a flowchart of a novel method 80 in accordance with one novel aspect. In a step 81, a radio frequency input signal is received onto the source leads of a first transistor and a second transistor. In one example, the source leads of the transistors are the source lead of first transistor 39 and the source lead of second transistor 40 of FIG. 2. Radio frequency input signal 32 is amplified by LNAs 17-19 and then received onto the source leads of transistors 39-40. In a step 82, an oscillator signal is received onto a gate lead of the first transistor and onto a gate lead of the second transistor. For example, an oscillator signal generated by local oscillator 36 within RF transceiver IC 11 is received onto the gate leads of transistors 39-40. In step 83, a baseband signal is output from a drain lead of the first transistor. For example, a baseband signal current 84 is output from the drain lead first transistor 39 in FIG. 2. The baseband signal has a current with a magnitude. In a step 85, the magnitude of the current of the baseband signal is increased by coupling the drain lead of the first transistor to a drain lead of the second transistor. For example, the drain lead of first transistor 39 is coupled to the drain lead of transistor 40 by closing switch 41. As shown in FIG. 2, switch 41 is coupled both to the drain lead of first transistor 39 and to the drain lead second transistor 40. Switch 41 is closed and switch 42 is opened when switching signal 43 is asserted.

In one or more exemplary embodiments, the functions described may be implemented in hardware, software, firmware, or any combination thereof. For example, mixer and amplifier control may be performed by software running in digital baseband IC 12. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although a stepped gain mixer has been described in connection with certain specific embodiments for instructional purposes, the stepped gain mixer is not limited thereto. For example, amplified stepped gain mixer portion 15 is described as part of receiver 10 of a handheld wireless device. Amplified stepped gain mixer portion 15, however, can also be used in the receiver in a base station of an OFDM communication system. In addition, amplified stepped gain mixer portion 15 can be used in a transmitter, such as in a wireless device or in a base station of an OFDM communication system. For example, stepped gain mixer 20 can be used to modulate baseband data onto an RF signal transmitted from the wireless device or base station. The previous description of the disclosed embodiments is provided to enable any person skilled in the art to make or use a stepped gain mixer. Various modifications to these embodiments will be readily apparent to those skilled in the art, and the generic principles defined herein may be applied to other embodiments without departing from the spirit or scope of disclosed subject matter. Accordingly, the disclosed stepped gain mixer is not intended to be limited to the embodiments shown herein but is to be accorded the widest scope consistent with the principles and novel features disclosed herein.

What is claimed is:

1. A device comprising:
   (a) an amplifier having an output lead;
   (b) a first transistor having a source lead, a drain lead and a gate lead;
   (c) a second transistor having a source lead, a drain lead and a gate lead, wherein the output lead of the amplifier is coupled to the source lead of the first transistor and to the source lead of the second transistor; and
   (d) a switch, wherein the drain lead of the first transistor is coupled to the drain lead of the second transistor through the switch when the switch is closed, and wherein an oscillating signal is present on the gate lead of the first transistor and on the gate lead of the second transistor.

2. The device of claim 1, wherein the amplifier has an input lead, and wherein the input lead of the amplifier is coupled to an antenna.

3. The device of claim 1, further comprising:
   (e) a filter having an input lead, wherein the input lead of the filter is coupled to the drain lead of the first transistor.

4. The device of claim 1, further comprising:
   (e) a second switch, wherein the drain lead of the second transistor is coupled to ground through the second switch when the second switch is closed.

5. The device of claim 1, further comprising:
   (e) a mixer control register, wherein the switch is closed when a switching signal is asserted, and wherein the switching signal is asserted when a bit of the mixer control register is written to.

6. The device of claim 1, wherein neither the first transistor nor the second transistor receives a biasing current.

7. The device of claim 1, wherein the device is part of an OFDM receiver.

8. A device that operates in a first mode and in a second mode, comprising:
   a first transistor with a source lead and a drain lead;
   a second transistor with a source lead and a drain lead;
   a third transistor with a source lead and a drain lead;
   a fourth transistor with a source lead and a drain lead, wherein a plus phase of a differential radio frequency input signal is present on each of the source leads of the first, second, third and fourth transistors;
   a first switch coupled to the drain lead of the second transistor, wherein the drain lead of the first transistor is coupled to the drain lead of the second transistor through the first switch when the first switch is closed in the first mode;
   a fifth transistor with a source lead and a drain lead;
   a sixth transistor with a source lead and a drain lead;
   a seventh transistor with a source lead and a drain lead;
   a eighth transistor with a source lead and a drain lead, wherein a minus phase of the differential radio frequency input signal is present on each of the source leads of the fifth, sixth, seventh and eighth transistors;
   a second switch coupled to the drain lead of the sixth transistor, wherein the drain lead of the fifth transistor is coupled to the drain lead of the sixth transistor through the second switch when the second switch is closed in the first mode; and
   a third switch that is open in the first mode, wherein the drain lead of the second transistor is coupled through the third switch to the drain lead of the sixth transistor when the third switch is closed in the second mode, wherein the first switch and the second switch are open in the second mode.

9. The device of claim 8, wherein the drain lead of the third transistor is coupled to the drain lead of the sixth transistor, wherein the drain lead of the fourth transistor is coupled to the drain lead of the fifth transistor, wherein the drain lead of the seventh transistor is coupled to the drain lead of the second transistor, and wherein the drain lead of the eighth transistor is coupled to the drain lead of the first transistor.

10. The device of claim 8, wherein each of the first, second, third, fourth, fifth, sixth, seventh and eighth transistors has a gate lead, wherein a minus-phase of an oscillator signal is present on the gate leads of the first, second, fifth and sixth transistors, and wherein a plus-phase of the oscillator signal is present on the gate leads of the third, fourth, seventh and eighth transistors.

11. The device of claim 8, wherein a plus phase of a differential baseband output current is present on the drain lead of the first transistor, and wherein a minus phase of the differential baseband output current is present on the drain lead of the fifth transistor.

12. The device of claim 11, wherein the differential baseband output current has a magnitude, and wherein the magnitude of the differential baseband output current in the first mode is greater than the magnitude of the differential baseband output current in the second mode.

13. The device of claim 8, wherein in the second mode current loops from the drain lead of the second transistor, through the third switch, and to the drain lead of the sixth transistor.

14. The device of claim 8, further comprising: a low noise amplifier having an output lead, wherein the output lead of the low noise amplifier is coupled to the source lead of the first transistor.

15. The device of claim 8, wherein the first switch is a transistor, and wherein the first transistor is more than twice as large of the transistor of the first switch.

16. The device of claim 8, wherein the first transistor does not receive a biasing current.

17. A method comprising:
(a) receiving a radio frequency input signal onto a source lead of a first transistor and onto a source lead of a second transistor;
(b) outputting a baseband signal from a drain lead of the first transistor, wherein the baseband signal has a current with a magnitude; and
(c) increasing the magnitude of the current of the baseband signal by coupling the drain lead of the first transistor to a drain lead of the second transistor, wherein the drain lead of the first transistor is coupled to the drain lead of the second transistor by closing a switch that is coupled to both the drain lead of the first transistor and the drain lead of the second transistor.

18. The method of claim 17, wherein neither the first transistor nor the second transistor receives a biasing current.

19. The method of claim 17, wherein the switch is a transistor, and wherein the switch is closed when a switching signal is asserted.

20. The method of claim 19, wherein the switching signal is asserted when a bit of a mixer control register is written to.

21. The method of claim 17, further comprising:
(d) receiving an oscillator signal onto a gate lead of the first transistor and onto a gate lead of the second transistor.

22. A circuit comprising:
(a) a first transistor having a drain lead, a source lead and a gate lead;
(b) a second transistor having a drain lead, a source lead and a gate lead, wherein an amplified radio frequency signal is present on the drain lead of the first transistor and on the drain lead of the second transistor, wherein a baseband signal having a current is present on the source lead of the first transistor, and wherein the current of the baseband signal has a magnitude; and
(c) means for controlling the magnitude of the current of the baseband signal by coupling the source lead of the first transistor to the source lead of the second transistor, wherein an oscillating signal is present on the gate lead of the first transistor and on the gate lead of the second transistor.

23. The circuit of claim 22, wherein neither the first transistor nor the second transistor receives a biasing current.

24. The circuit of claim 22, wherein the means comprises a switch, and wherein the magnitude of the current of the baseband signal increases when the source lead of the first transistor is coupled to the source lead of the second transistor by closing the switch.

25. The circuit of claim 22, wherein the means comprises a register, and wherein the magnitude of the current of the baseband signal increases in response to a bit of the register being written to.

* * * * *